(12) United States Patent
Lin et al.

(10) Patent No.: US 8,964,458 B2
(45) Date of Patent: Feb. 24, 2015

(54) DIFFERENTIAL MRAM STRUCTURE WITH RELATIVELY REVERSED MAGNETIC TUNNEL JUNCTION ELEMENTS ENABLING WRITING USING SAME POLARITY CURRENT

(75) Inventors: Kai-Chun Lin, Hsinchu (TW);
Hung-Chang Yu, Hsin-Chu (TW);
Yue-Der Chih, Hsin-Chu (TW);
Chun-Jung Lin, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 76 days.

(21) Appl. No.: 13/446,250

(22) Filed: Apr. 13, 2012

(65) Prior Publication Data

US 2013/0272059 A1    Oct. 17, 2013

(51) Int. Cl.
*G11C 11/16* (2006.01)

(52) U.S. Cl.
USPC .......................................... 365/158; 365/148

(58) Field of Classification Search
None
See application file for complete search history.

(56) References Cited

U.S. PATENT DOCUMENTS

| | | | |
|---|---|---|---|
| 8,004,880 B2 | 8/2011 | Yoon et al. | |
| 8,023,299 B1 * | 9/2011 | Gharia | 365/49.1 |
| 2004/0130939 A1 * | 7/2004 | Morikawa | 365/158 |
| 2006/0023532 A1 * | 2/2006 | Hush et al. | 365/203 |
| 2008/0298114 A1 * | 12/2008 | Liu et al. | 365/148 |
| 2010/0223532 A1 | 9/2010 | Kang et al. | |
| 2011/0157971 A1 | 6/2011 | Kim et al. | |

FOREIGN PATENT DOCUMENTS

| | | |
|---|---|---|
| KR | 2010-0098969 | 9/2010 |
| KR | 2011-0078181 | 7/2011 |
| KR | 2012-0003007 | 1/2012 |
| WO | 2010114893 A1 | 7/2010 |

OTHER PUBLICATIONS

Kim, J.P. et al., "A 45nm 1Mb Embedded STT-MRAM with design techniques to minimize read-disturbance", 2011 Symposium on VLSI Circuits (VLSIC), Jun. 2011, pp. 296-297.
Huai, Y., "Spin-Transfer Torque MRAM (STT-MRAM):Challenges and Prospects", AAPPS Bulletin, Dec. 2008, 18(6):33-40.

(Continued)

*Primary Examiner* — James G Norman
(74) *Attorney, Agent, or Firm* — Duane Morris LLP

(57) ABSTRACT

A magnetoresistive memory has first and second magnetic tunnel junction (MTJ) elements operated differentially, each with a pinned magnetic layer and a free magnetic layer that can have field alignments that are parallel or anti-parallel, producing differential high and low resistance states representing a bit cell value. Writing a high resistance state to an element requires an opposite write current polarity through the pinned and free layers, and differential operation requires that the two MTJ elements be written to different resistance states. One aspect is to arrange or connect the layers in normal and reverse order relative to a current bias source, thereby achieving opposite write current polarities relative to the layers using the same current polarity relative to the current bias source. The differentially operated MTJ elements can supplement or replace single MTJ elements in a nonvolatile memory bit cell array.

17 Claims, 7 Drawing Sheets

(56) References Cited

OTHER PUBLICATIONS

Chen, Y. et al., A Nondestructive Self-Reference Scheme for Spin-Transfer Torque Random Access Memory (STT-RAM), Automation & Test in Europe Conference & Exhibition Design, Mar. 2010, pp. 148-153.

Hai, H. et al., "Design Methodologies and Circuit Techniques for Emerging Non-Volatile Memories", 23 pages.

Official Action issued Sep. 17, 2013 in counterpart Korean Patent Application No. 10-2012-0089356.

Official Action issued Mar. 27, 2014 in counterpart Korean Patent Application No. 10-2012-0089356.

\* cited by examiner

DIFFERENTIAL MRAM STRUCTURE WITH RELATIVELY REVERSED MAGNETIC TUNNEL JUNCTION ELEMENTS ENABLING WRITING USING SAME POLARITY CURRENT

BACKGROUND

Spin-transfer torque magnetoresistive random access memories (STT-MRAM) are nonvolatile memories that store changeable bit data values in the relative orientations of magnetic fields in one or more magnetic terminal junction (MTJ) elements that comprise a fixed magnetic layer and a changeable magnetic layer, separated by a nonmagnetic conductive barrier.

A binary data value is represented in an MTJ element, by orienting the changeable magnetic layer parallel to the fixed magnetic layer, which is a low resistance state, or anti-parallel, which is a high resistance state. For reading out the stored bit data value, the serial resistance through the layers is detected by comparison with a threshold value, typically comparing a current or voltage parameter that varies with resistance, versus a threshold of current or voltage representing a resistance between the high and low resistance states.

When writing a data value to an MTJ element, a write bias current of a particular current polarity, and at least a minimum amplitude, is passed through the element. Opposite polarity write currents are necessary to impose opposite data values represented by the high and low resistance states. When reading out the stored value in the MTJ element (i.e., when detecting its resistance state), the current or voltage coupled to the element for producing a voltage or current, respectively, according to Ohm's Law V=IR must be at one polarity or the other. Therefore, there is a potential that some combinations of a present resistance state and a particular read current polarity may inadvertently change the state of the MTJ element during a read operation. This is known as a read disturb error.

A memory circuit containing MTJ elements typically has numerous addressable data words having bit positions, each word and bit position having an associated MTJ element that can be coupled to a sense amplifier operating as a comparator, to read out the data value of that bit. Inasmuch as the high and low resistance values of the numerous MTJ elements are distributed over a range, a problem is encountered in defining the best threshold value to use when attempting to discern whether the MTJ element is in its high or low resistance state. In some possible methods for discriminating for resistance using comparison thresholds, the chosen threshold may fall outside the span between the high resistance RH and low resistance RL of some of the MTJ elements, making those bits defective even though the MTJ elements are operational to assume distinct resistance states. According to product selection criteria, at some number of defective bits (possibly only one bit), the memory circuit may be considered defective.

Instead of seeking to specify a fixed resistance (or related voltage or current parameter) for as a comparison threshold, two or more MTJ elements can be associated together as one bit cell with plural MTJ elements. Assuming two MTJ elements, one of the two MTJ elements is kept in a high resistance state when the other is in a low resistance state. The binary data value stored by the bit cell is defined by which of the two is in the high resistance state and which is in the low resistance state.

Writing any value to a two-MTJ bit cell requires the application of write currents of opposite polarity to the two MTJ elements of the bit cell, respectively. The particular logic value that is written depends on the sense of the opposite polarities, such as positive/negative to write a binary one and negative/positive write a binary zero. The two logic values are represented by high/low or low/high resistance states in the two MTJ elements.

It is useful to have two MTJ elements in one bit cell because the resistances of the two (or a resistance related parameter such as voltage or current) can be compared against one another instead of being compared against an external reference. But developing parameter values that can be compared requires the application of current bias and the bias is necessarily at one polarity or another. The logic value stored in a bit cell is arbitrary and unknown until it is read out. The two MTJ elements are maintained in opposite resistance states, regardless of logic value. There seems to be an inherent risk of read-disturb errors and a need to limit the amplitude of read current bias for all bit cells to an amplitude that will not disturb the resistance state of the most sensitive MTJ element in the memory array.

Techniques are needed to optimize operation of plural MTJ elements used in sets of two or more complementary elements forming a bit cell. Such techniques should optimize the balance between the selection rate of MTJ elements (considering that their high and low resistance values vary over a statistical distribution) versus the need to conserve circuit area (given that two MTJ elements occupy twice the area of one MTJ element). Such techniques should also take into account that the need for opposite polarity read and write current bias and the need to switch that opposite polarity back and forth as function of logic level, require that some of the circuit area be devoted to switching devices as opposed to MTJ elements for nonvolatile storage of information in a changeable resistance.

SUMMARY

It is an object of the present disclosure to provide an effective STT-MRAM configuration that employs in one memory device an optimized combination of MTJ elements that are arranged such that some MTJ elements have a normal order and others have a reversed order of their free and pinned magnetic layers, compared to the current bias source and switching elements that address the bit cells in the memory device for reading and writing their logic values.

It is another object to provide a memory device wherein at least some bit cells are multiple-MTJ element bit cells having at least two MTJ elements paired with one another, and operated in complementary manner such that one is in a high resistance state when the other is in a low resistance state; wherein such states can be switched vice versa, and wherein the two MTJ elements are arranged in the circuit for operation using the same switching and current bias supply configuration as a bit cell having only one MTJ element.

A further object is to configure a memory with bit cells using two complementary MTJ elements operated in complementary manner and with the same switching and current bias supply configuration for both of the MTJ elements in that bit cell, by providing for regular and reverse order MTJ elements. The regular and reverse order elements can be disposed at different areas of one or more integrated circuits, so that the manufacturing process is simplified in that the pinned or the free magnetic layers for the MTJ elements are deposited in the same order for all the MTJ elements in local zones of the circuit or in discrete circuits that are used together with one another to provide MTJ elements with different free/pinned and pinned/free layer orders.

In another aspect, some of the bit cells in the memory can comprise two paired magnetic tunnel junction (MTJ) elements per bit cell whereas other bit cells use only one MTJ element per bit cell. Bit cells that require high reliability can be tested preliminarily in a selection process to confirm that their high and low resistances are dependably higher and lower than a comparison reference, for example a fixed reference. Unselected/rejected bit cells can be disabled using a fuse array. Alternatively or in addition, bit cells can be provided in the same memory element with two MTJ elements deposited or wired in reverse pinned/free and free/pinned order, whereas other bit cells have only one MTJ element, and yet all the bit cells, whether single or dual MTJ element bit cells and whether normal or reverse in pinned/free or free/pinned order, employ the same switching arrangements to couple read and write currents and to switch polarities of read and write current bias, to all the MTJ elements and all the bit cells.

Additional objects and aspects of this disclosure will become evident from the following discussion of exemplary embodiments.

BRIEF DESCRIPTION

There are shown in the drawings certain exemplary embodiments intended to illustrate aspects of the subject matter disclosed. The subject developments are not limited to the embodiments illustrated as examples, and reference should be made to the claims to assess the scope of the subject matter. In the drawings, FIG. 1 is a simplified schematic illustration showing write bias current conditions effective for writing a high resistance state and a low resistance state into a magnetic tunnel junction element (MTJ), for example for setting the value of a one-MTJ element bit cell in a memory. Note that the required current polarity depends on the resistance state to be imposed or written into the MTJ element.

FIG. 2 is a schematic diagram corresponding to FIG. 1, but wherein two MTJ elements are provided in each bit cell and are maintained at opposite high/low or low/high resistance states representing the two possible logic values of the bit cell. The write currents on lines BL and BL' are at opposite polarities within each bit cell.

FIG. 3, labeled as prior art, compares a schematic diagram of an integrated circuit layout for one bit cell, arranged for opposite polarity write current bias.

FIG. 4 schematically compares the operation of single-MTJ bit cells and dual-MTJ bit cells during read operations. A comparison technique discerns whether a bit cell is in a low or high resistance state compared to a reference low/high or high/low resistance state, and in dual MTJ bit cells, the comparison discerns which of the dual MTJ elements has a higher or lower resistance relative to the other.

FIG. 5 represents a configuration according to an embodiment wherein the free and pinned layers of two MTJ elements are arranged in reverse order compared to one another, so as to enable the write bias current for both MTJ elements to have the same polarity. The polarity of the write bias current to both MTJ elements determines whether the resulting resistance levels are low/high or high/low, those levels representing different logic states.

DETAILED DESCRIPTION

Figure 1:
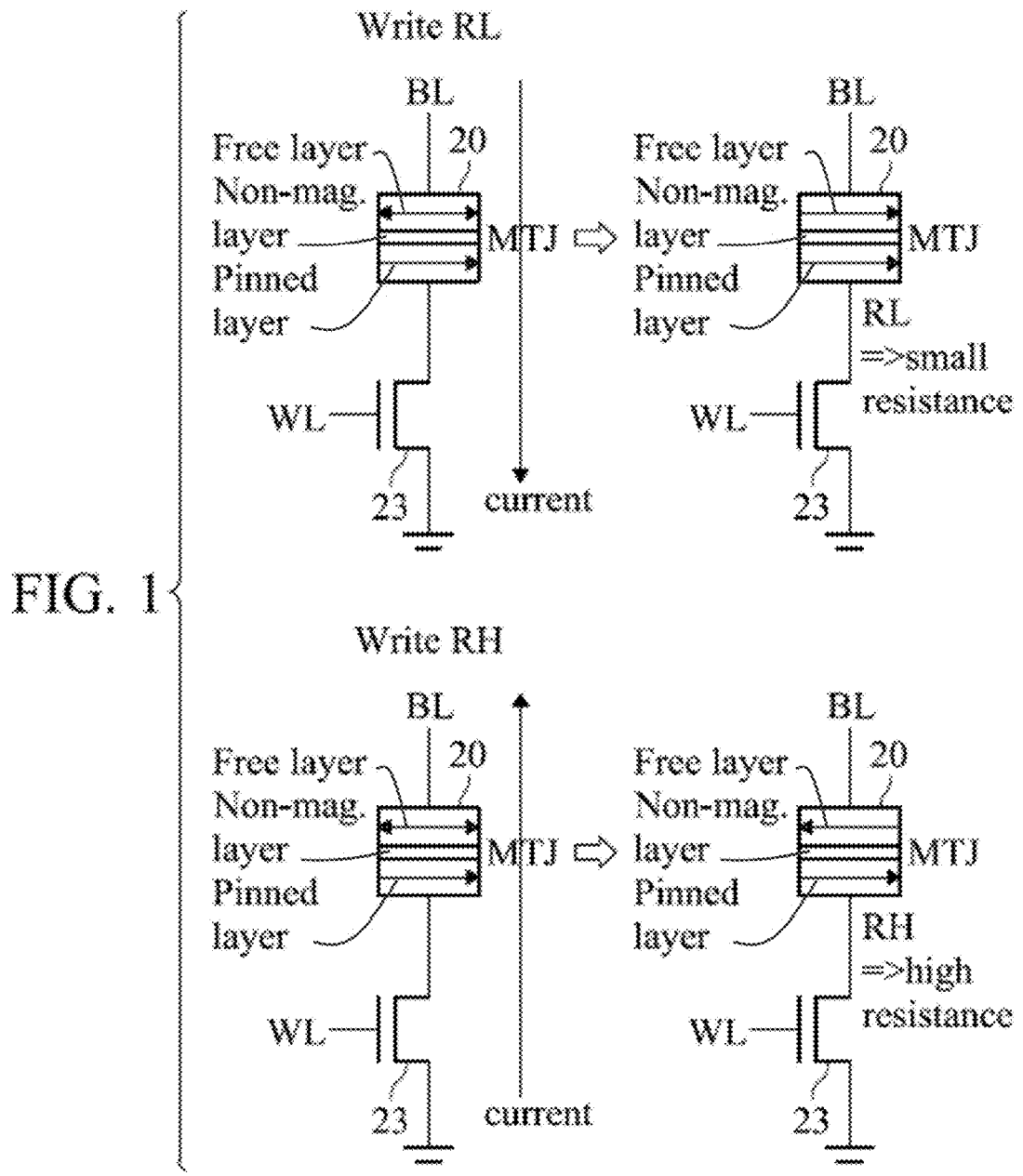

One magnetic layer of a magnetoresistive magnetic tunnel junction (MTJ) element has a permanently aligned field and is generally termed the pinned layer or reference layer. The other magnetic layer has a changeably-aligned field that either is aligned with the field of the pinned layer (parallel and with the same north/south polarity), or directly opposite (anti-parallel) to the field of the pinned layer. The layer with the changeable field orientation is termed the free layer or sense layer. The free and pinned layers are separated by a barrier layer.

When the fields in the two layers are parallel, the electrical resistance to current flowing through the two layers and the separating conductive barrier layer of the magnetic terminal junction (MTJ) element is relatively lower and when the fields in the two layers are anti-parallel, the electrical resistance is relatively higher. According to Ohm's Law (V=IR), the resistance of the element produces a voltage when a current is passed through the cell. Therefore, when applying a predetermined current bias amplitude through the MTJ, which current amplitude is equal when the MTJ in these high or low resistance states, a higher or lower voltage difference is obtained, depending on the present resistance state of the MTJ. Similarly, if one applies a predetermined equal voltage to an MTJ element, the current drawn through the element will be different when the MTJ is in the high resistance or low resistance state. As a theoretical matter, by applying a bias current (or voltage) and using a comparator circuit for distinguishing whether the resulting voltage (or current) is higher or lower than an intermediate threshold level, the state of the MTJ can be distinguished as being in the high or low resistance state. Thus, the MTJ element can be useful as a one bit memory element whose resistance state represents a logic value that is read out in that way.

Writing a value to the magnetic terminal junction element involves imposing onto the free layer a magnetic field alignment that either is parallel or anti-parallel to the magnetic field alignment of the pinned layer. One writing technique is to transfer the magnetic field alignment of the pinned layer to the free layer by applying a write current through the two element layers, at a current polarity that passes electrons first through the pinned layer and from there into the free layer. The spins of the electrons become aligned to the field in the pinned layer when propagating through the pinned layer. The aligned electron spins carry that alignment into the free layer and if the write current amplitude is sufficient, cause the free layer to assume a parallel alignment with the pinned layer.

A write current amplitude of the opposite polarity can write from the low resistance state into the high resistance state. In that case, the electrons entering the free layer in the write current flow have random electron spin orientations. If sufficient in amplitude, the write current releases any preexisting alignment of the free layer. A field aligned anti-parallel to the field of the pinned layer is imposed magnetically on the free layer, because proximity with the permanent magnetic field of the pinned layer induces a magnetic field with an anti-parallel alignment. This effect is similar to magnetizing a previously un-magnetized ferromagnetic bar by placing a permanent magnet against the ferromagnetic bar, thereby inducing in the bar a magnetic field that is complementary to that of the permanent magnet.

From the foregoing description, it can be appreciated that the write current polarity needed when inducing a high resistance state, including by writing from an existing low resistance state into a high resistance state, is opposite from the polarity needed when inducing a low resistance state, such as writing from an existing high resistance state into a low resistance state. On the other hand, when reading the MTJ resistance, a current of either polarity can sense resistance according to Ohm's Law, and can be used in conjunction with a comparator and a comparison threshold reference to read out a high or low resistance state. A read current amplitude should prudently be kept lower than the amplitude that might induce a change in resistance state inadvertently. A read current polarity might also preferably be applied at a polarity that is opposite from the polarity that could write a change of state to the MTJ resistance, but a given MTJ element at any time might arbitrarily be in either the high resistance state or the low resistance state (logic one or logic zero), the polarity that would risk a read-disturb error is unknown. When writing a desired resistance state to an MTJ element, it is possible to apply the polarity that will achieve that state without regard to whether the element was in the high resistance or low resistance state prior to the read operation. When reading an unknown resistance state, there is a risk of read-disturb error if the MTJ element is in one of its two possible resistance states.

Magnetoresistive random access memories have advantageous aspects, although they have yet to be widely accepted. Magnetic tunnel junction elements can be densely mounted on silicon circuit substrates. Connections for reading and writing can be made by word lines and bit lines for addressing, using epitaxial production processes. The word lines and bit lines can cross, forming a grid pattern, with the MTJ elements located at the crossing points. MRAM devices store information in the absence of power (they are nonvolatile). The electric power needed for read and write operations is modest. Operation is possible at frequencies comparable to the operational frequencies of volatile memories having active switches, but MRAMs have less current leakage.

On the other hand, there are practical challenges. The high and low resistances of the magnetic tunnel junction elements and the ratio of their resistances are dependent on dimensions, such as the thicknesses of the magnetic layers and the nonmagnetic separating layer. Areas and thicknesses can vary between circuits and also from one magnetic tunnel junction element to another on the same circuit, leading to differences in the resistances of the high resistance states and low resistance states of different MTJ elements in the same circuit device. The conductors coupling the elements to sensing circuits vary in their dimensions (length and cross sectional area), which introduces differences in the resistance of the series circuits that include the MTJ elements, if not in the elements themselves. These factors are such that there is a statistical distribution of different high and low resistances among the MTJ elements of a memory array.

Any given one of the MTJ elements in the population has a distinctly different electrical resistance when in its parallel and anti-parallel field states. But the resistance in the anti-parallel (high resistance) state of some MTJ elements in the population may actually have a lower resistance than the resistance of other MTJ elements in the same array that are in their parallel (low resistance) state. As a result of element variations, read disturb errors may occur in some MTJ elements in the population if one employs a simple current bias source, a fixed voltage reference for threshold comparison and a voltage comparator circuit to read out the logic level of a bit cell by distinguishing between whether the resistances of two or more MTJ elements are higher or lower than the reference. (Although this description generally refers to comparing resistances against a threshold, it should be understood that embodiments typically compare a resistance-related parameter such a voltage or current to a comparison threshold using a voltage or current comparator.)

A quality assurance test process can be used to test and verify that each of the MTJ elements in an array of MTJ elements has a high resistance above a threshold and a low resistance below a threshold that is used as a reference for comparison when reading out the values of individual MTJ elements. The elements that don't meet the test criteria can be disabled by fused links and their bitlines/wordlines bypassed. But it would be advantageous to minimize the need to disable MTJ elements.

For any given MTJ element, the $R_H$ resistance is dependably greater than the $R_L$ resistance for that element, even though the resistance values may vary or the $R_H/R_L$ ratio might vary. Therefore, self-reference methods are possible. For example, a read operation may have the object to compare the resistance at a present unknown resistance state of an MTJ versus a resistance state that is obtained after attempting to impose a high or low resistance state on the same MTJ. If the resistance doesn't change, the written state and the unknown state were the same state. This technique is dependable but slow, because the original state of the MTJ must be written back after discerning whether the original state was one of parallel (low resistance) or anti-parallel (high resistance) magnetic field orientations. There is also a danger of memory loss if operations are lost during the process of discerning and writing back the original state.

Another technique is to use two MTJ elements together rather than one. Two or more MTJ elements in different resistance states can supply a threshold comparison to a comparator circuit, based on their average resistances. Two or more MTJ elements can be provided for individual bit cells, the MTJ elements of a bit cell being maintained in opposite resistance states. Whether the two MTJ elements are in high/low or low/high resistance states determines the logic value of the bit cell. The resistances for individual MTJ elements in an array may vary, but the effect of variations in individual resistances is moderated if the average or the high versus low resistances of two paired MTJ elements is the basis for comparison.

Using a single MTJ element and attempting to discern its resistance state as high or low by comparison with a fixed voltage reference will introduce errors (some number of defective MTJ elements) because the high and low resistances of some MTJ elements are outside of expected maximum and minimum high resistance and low resistance values. Using two paired MTJ elements makes it more dependably possible to distinguish the logic state of a bit cell by determining whether the paired MTJ elements have high/low or low/high resistance states. There are tradeoffs between the selection rate, given that some proportion of bit cells with individual MTJ elements must be rejected, versus the bit cell spatial density because only half as many bit cells can be provided in a given circuit area if two MTJ elements are needed for each bit cell.

As already mentioned, the write current bias polarity needs to be different when writing to the high resistance state versus writing to the low resistance state. When providing two complementary MTJ elements for a bit cell and keeping the two MTJ cells in complementary resistance states (high/low or low/high), the polarity of the write current needs to be different for writing to the two MTJ cells, and switched between opposite polarities when writing to a high/low state versus writing to a low/high state. The read bias current polarity optionally can also be controlled in a complementary way, so to that the current bias applied for reading the resistance state of the MTJ element is always at the current polarity that is opposite from the polarity that might write a change of resistance state into the MTJ element (i.e., to prevent read-disturb errors). Alternatively, the read current bias can be kept always at the same polarity, but the amplitude of the read current need to be dependably less than the current that could write a new resistance state to the MTJ element in any given logic state of the bit cell.

It is possible to provide circuitry to manage switching of complementary-opposite current polarities for two MTJ elements in a bit-cell, and also circuitry for switching between polarities needed for writing to a high/low state versus a low/high state. But such switching arrangements require circuit space and switching requirements affect the time needed to effect read and write operations, limiting the maximum frequency at which a memory can be operated. Furthermore, the switching arrangements must be configured for each bit cell in a memory, because the logic values stored by virtue of whether their paired MTJ elements are in high/low or low/high resistance states is totally arbitrary. The necessary read and write current polarities change with the logic data values that are written into the memory.

In embodying a memory device using MTJ elements, thousands of individual elements are provided on a circuit chip by epitaxial processes wherein the layers that form the pinned layer, the nonmagnetic separating layer and the free layer are typically deposited over top of one another in layers. For ease of manufacturing in a process of depositing layers, the same functional layers of all of the MTJ elements at least in a local circuit area are deposited in a given manufacturing step. As a result, the circuit chip is structured with the free layer over the pinned layer or with the pinned layer over the free layer for all the MTJ elements in that area. Insofar as individual MTJ elements may be operated in a complementary way in pairs, switching arrangements need to change current polarities as applied, because the order in which the layers are deposited may make it impractical for adjacent MTJ elements associated as a pair, to be deposited in such a way that the ordering of the free and pinned layers is different for the two MTJ elements in the pair.

Several exemplary but non-limiting embodiments of spin-transfer torque magnetoresistive random access memories (STT-MRAM) and memory elements (bit cells) are shown in the drawing figures. In each case, the memory bit cells are nonvolatile memory storage elements that store changeable bit data values by virtue of the relative orientations of magnetic fields in plates or layers of magnetic material abutted against one another while separated by a nonmagnetic conductive barrier layer. The junction is termed a magnetic terminal junction or MTJ and the juxtaposed layers together form a magnetic terminal junction element 20. An MTJ element can function as a basic one bit storage unit as shown in FIG. 1. In some embodiments such as that shown in FIG. 2, at least two MTJ elements are paired and kept in complementary high and low resistance states, the ordering of which states represents a bit logic value. The MTJ elements 20 are coupled to at least one switching transistor 23, for applying current bias during read and write operations. In FIG. 1, for example, MTJ elements 20 are coupled between a bit line BL that when at a positive voltage functions as a current source, and an NMOS transistor 23 responsive to a positive voltage on a word line WL to pass current through the MTJ 20.

One magnetic layer, labeled as the pinned layer, has a permanent magnetic field aligned in the direction of the single-headed arrow shown on the left side of FIG. 1. The other magnetic layer, identified as the free layer, is changeable as to the alignment of its magnetic field. An uncertain or changeable magnetic alignment for the free layer is shown as a line with an arrowhead on both ends.

The MTJ element 20 is capable of a low resistance state if the magnetic field of the free layer is aligned parallel to and in the same direction as the field of the pinned layer, or a high resistance state if the magnetic field of the free layer is directly opposite or anti-parallel to the alignment of the pinned layer. In order to write to or induce the MTJ to assume a low resistance state, a write current of sufficient amplitude is passed through the MTJ 20 with a polarity causing electrons to propagate from the pinned layer into the free layer. The electrons are polarized to assume a spin orientation while propagating through the pinned layer. With sufficient amplitude, the polarized electrons impart the same magnetic field alignment into the free layer as in the pinned layer. The application of a positive current bias from the free layer to the pinned layer as shown by the current arrow at the upper left in FIG. 1, leading to propagation of electrons from the pinned layer into the free layer, produces the result as show at the top right of FIG. 1. The free and pinned layers of the MTJ 20 are caused to have the same parallel alignment. This is the low resistance state RL of the MTJ 20, achieved by one write current polarity as shown.

By comparison and as shown at the bottom of FIG. 1, a write current of sufficient amplitude and the opposite polarity cause electrons without a specific spin orientation to propagate into and through the free layer to the pinned layer (the electrons have randomly aligned spins). In sufficient amplitude, the write current removes any preexisting magnetic field in the free layer, which permits the magnetic field of the pinned layer magnetically to induce a complementary field onto the free layer, anti-parallel to the field in the pinned layer. This is the high resistance state RH of the MTJ 20, as at the lower right in FIG. 1, achieved by the opposite write current polarity as shown.

The particular resistances at RL and RH vary with materials and dimensions of the MTJ layers. A typical MTJ 20 might have an RL/RH characteristic of 200Ω and 400Ω, but variations resulting from routine manufacturing variations are such that some MTJ elements in an array of MTJ elements on an integrated circuit have resistances that are higher than the resistances of other elements, or lower.

Figure 2:
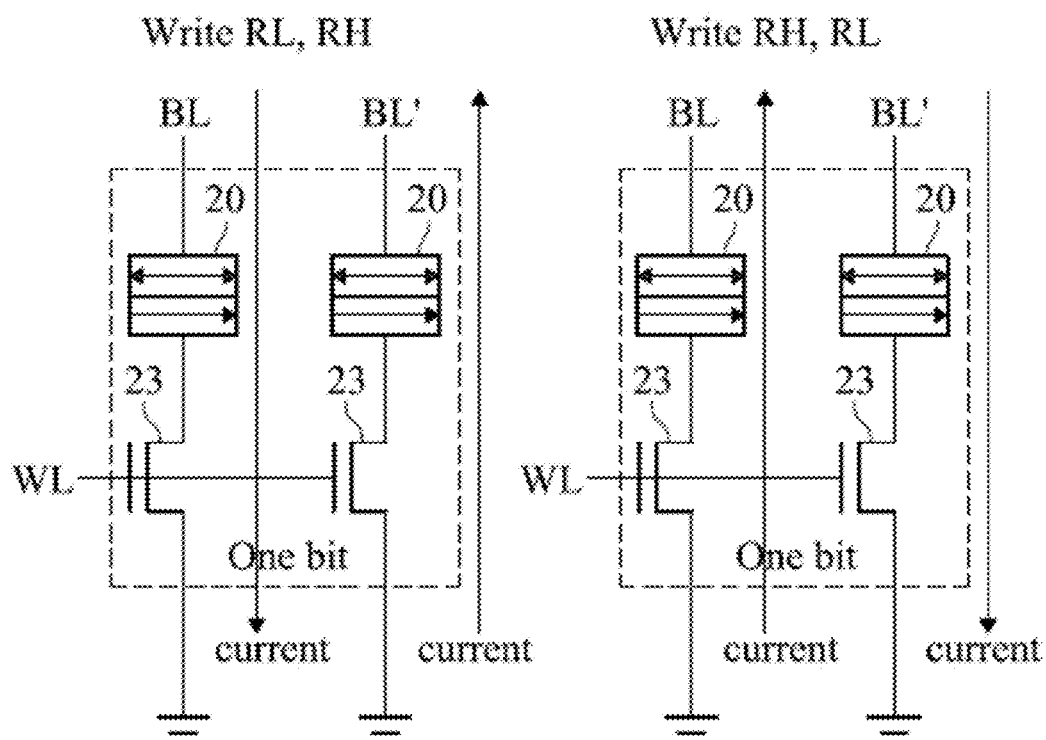

Referring to FIG. 2, it is possible to provide two MTJ elements 20 for each bit cell and to operate the two MTJ elements in a complementary manner such that one is always in one of states RL or RH and the other is in the complementary state RH or RL. As discussed above, the redundancy of a complementary pair of MTJ elements 20 is useful, especially to reduce the proportion of MTJ elements in an array that must be regarded as defective because manufacturing variations may have caused their RL and RH states to both fall on the same side of (higher or lower than) a reference threshold. However as shown in FIG. 2, the fact that there are MTJ elements to be written to different RL, RH states means that it is necessary to provide two write current sources of different polarities. While it is possible to arrange for two current sources and switchable polarity current bias arrangements as a function of the data value to be written to the cell, such arrangements introduce complexity and use integrated circuit area that might be reserved for other functions.

Figure 3:
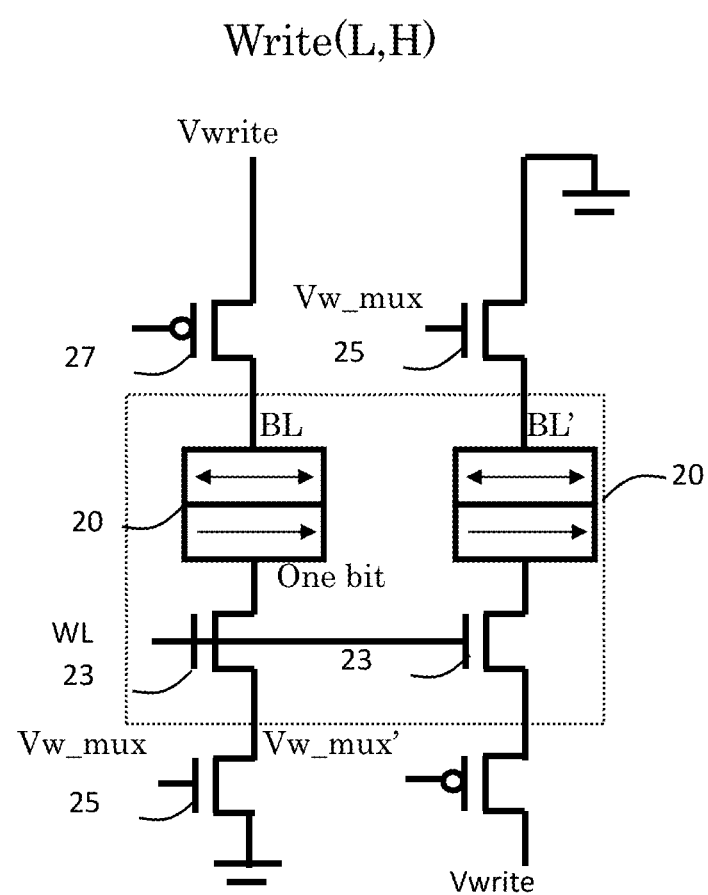

FIG. 3 schematically and physically shows a two-MTJ bit cell, with reference to a circuit layout, a practical application of source bias current supply, bitline and wordline input signals and a switching transistor 23 to for selecting polarities as a function of the logic level to be written may require six switching transistors in a dual MTJ configuration for writing one of two logic states. At least one additional transistor of an opposite MOS polarity may be needed to manage writing the complementary state, as shown by complementary CMOS transistors 25 (NMOS) and 27 (PMOS). In this example, labeled prior art, the MTJ elements 20 are coupled to biasing arrangements of opposite polarity by switching circuits with different PMOS and NMOS transistor layouts that are configured oppositely relative to the bias source $V_{write}$ and ground potential.

Figure 4:
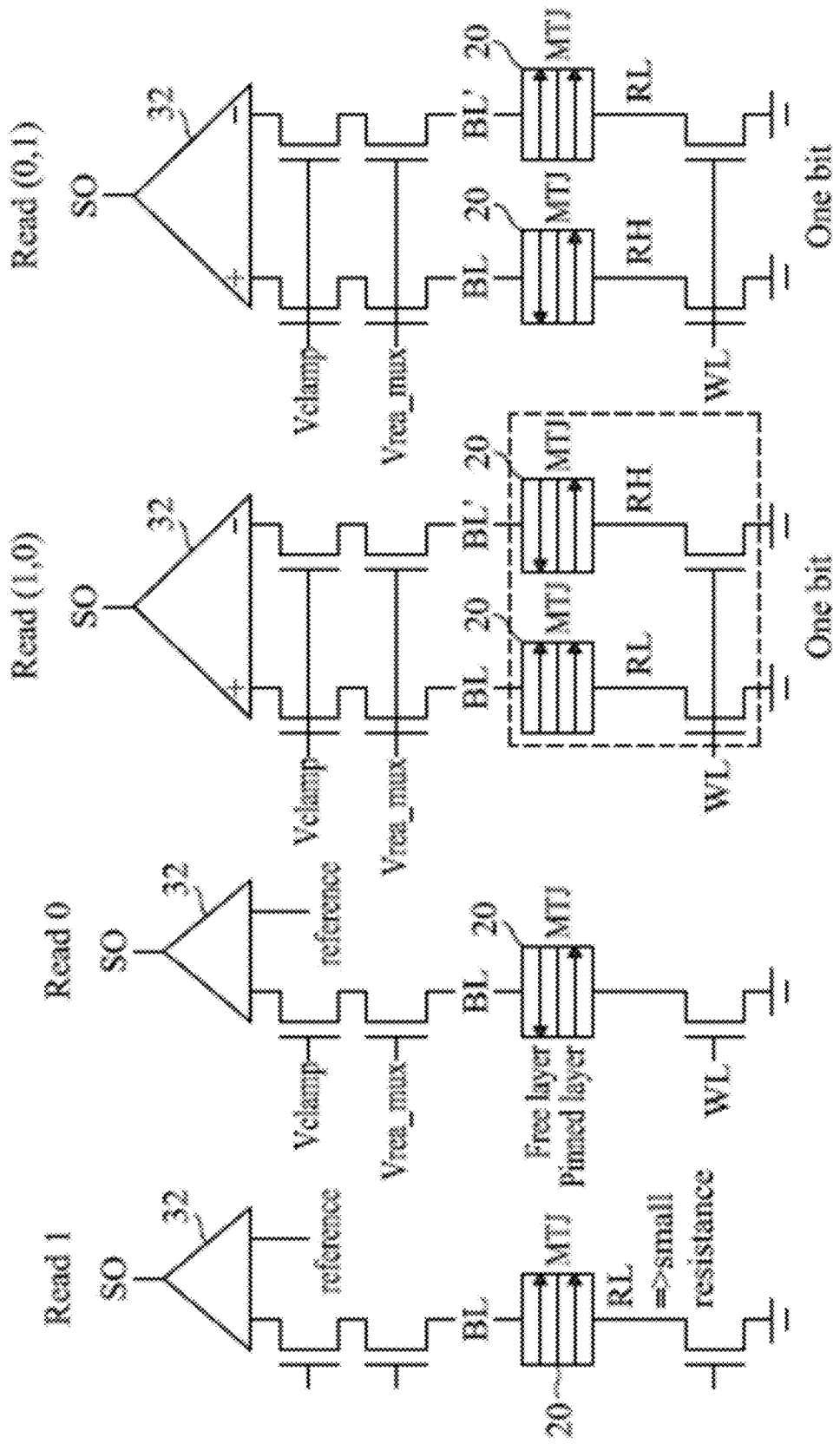

FIG. 4 shows further arrangements for applying a read current bias and discerning whether the resistances of MTJ elements are greater or less than a reference level. In this embodiment, some bit values are represented by the resistance states of individual MTJ elements 20 and other bit values are represented by the complementary resistance states of two MTJ elements 20 associated as a pair.

The left side of FIG. 4 demonstrates comparing the voltage developed across single MTJ elements 20 by applying a predetermined read current bias, versus a reference voltage "reference," that ideally is between the voltages that result in the high and low resistance states of the MTJ 20. In a dual MTJ arrangement shown on the right side of FIG. 4, the resistances of two associated MTJ elements 20 are compared against one another (high to low or low to high resistances) instead of against a predetermined threshold resistance, namely the resistance that will produce a fixed voltage applied to an input of a voltage comparator 32 to produce a sense output signal SO as in FIG. 4. The technique of using two MTJ elements 20, maintained at complementary high/low or low/high resistance states, avoids reliance on a fixed reference. The complementary technique is effective provided that the RH resistance of each MTJ in the pair of MTJs is greater than the RL resistance of the other MTJ in the pair. This relationship is true of a high percentage of MTJ elements even with due regard to manufacturing variations.

An issue with these read arrangements is that the same current polarity is used to read both MTJ elements in the pair regardless of their RL or RH state. If the current applied to one of the MTJ elements is the same polarity as the polarity that could write to the MTJ element due to its preexisting resistance state, there is a danger of read-disturb errors wherein the resistance state of an MTJ element is inadvertently changes because the read current amplitude was sufficient to induce the free layer to change its magnetic field alignment. Avoiding the risk generally requires that the read current amplitude be kept well below the amplitude that produces a change of resistance state.

Figure 5:
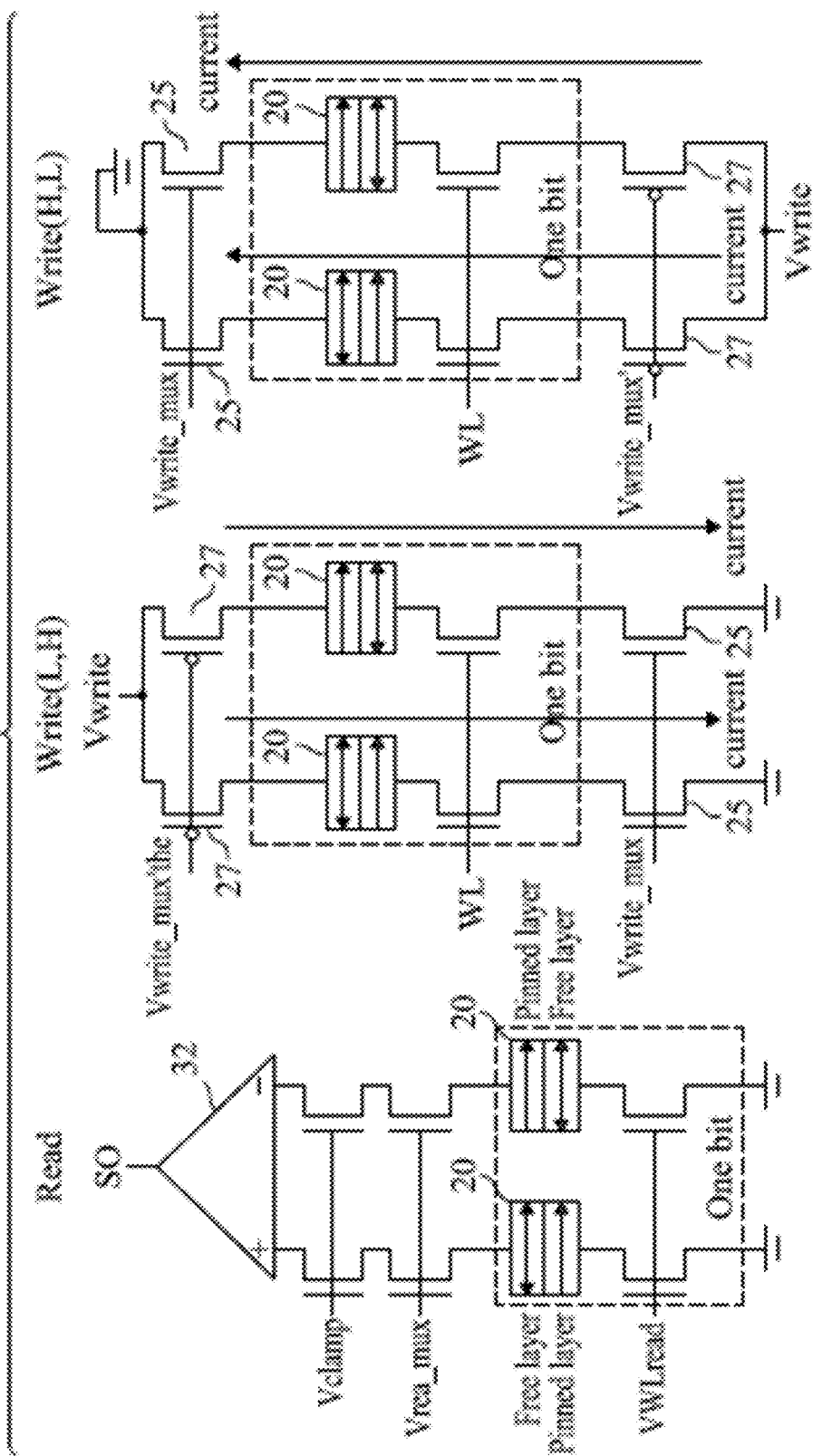

In an embodiment, shown for example in FIG. 5, two MTJ elements are provided in a bit cell configured such that the relative order of the free and pinned layers of the two MTJ elements in the bit cell are reversed in order compared to one another. Therefore, application to the two MTJ circuits of a current of a given polarity, passes through the MTJ element free and pinned layers in opposite order. In this embodiment, the RH and RL resistance states of the two MTJ elements in the bit cell are kept complementary to one another as already described. The read current bias is at a predetermined read current polarity and at an amplitude that is safely lower that the necessary write current amplitude for the one of the dual MTJ elements that might be susceptible to a read disturb error. The read-sense operation is accomplished by comparing the resistances of the two MTJ elements, one which is always in the high resistance state when the other is in a low resistance state and vice versa. The comparator 32 is a high gain inverting amplifier and the logic level of the dual MTJ bit cell is read out as a high or low output of the comparator achieved in respective RH/RL or RL/RH states of the two MTJ elements. Inasmuch as the two MTJ elements are kept in complementary resistance states and the stored data value is unknown, there is a read disturb risk to at least one of the MTJ elements during any read operation.

When writing to the dual MTJ element in FIG. 5, the write current polarity to be used differs with the logic value to be written into the bit cell. A positive polarity is shown for writing RL/RH and a negative polarity is chosen for writing RH/RL. Apart from selection of the write current polarity as a function of desired written resistance states, no different provisions are required for the two MTJ elements because the magnetic layers of the two MTJ elements are arranged in opposite order of pinned-free for one MTJ 20 and free-pinned for the other MTJ 20. based on whether the bit cell is to be written to RL/RH. The write currents applied to both of the two MTJ legs are at the same polarities.

Accordingly, by providing a normal order of the free and pinned layers in one of two dual MTJ elements 20 and a reversed order of pinned and free layers for the other of the MTJ elements, a substantial part of the current switching complexity is avoided, that otherwise would be needed to achieve the necessary two different write polarities as a function of RH and RL resistance states.

Figure 6:
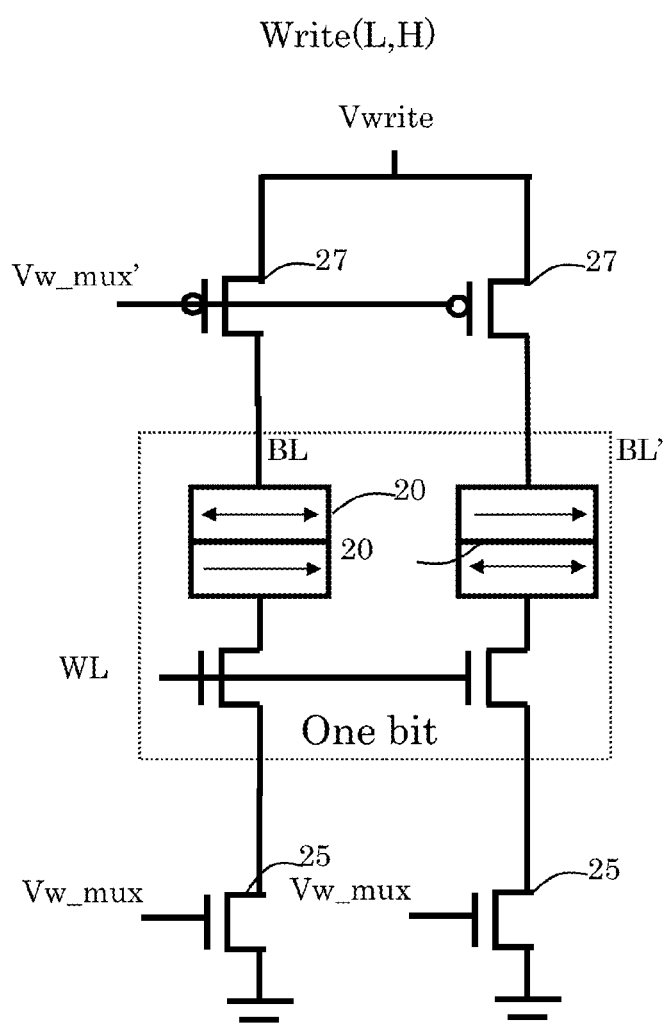
FIG. 6 is a schematic diagram of an embodiment of a self-referenced bit cell wherein the write bias current polarity is the same for two MTJ elements forming a bit cell.

In FIG. 6, the write current bias is positive from source $V_{write}$ to ground and is switched on when signals WL and $V_{w\_mux}$ are high and complement signal $V_{w\_mux}$' is low. This current writes a high resistance state to one of the two MTJ elements and a low resistance state to the other. The $V_{w\_mux}$ and $V_{w\_mux}$' signals enable current along the columns in the array of MTJ elements in the deposited circuit, as a bitline selecting all the bit cells in the column. The WL wordline signal selects the row. Only the bit cell at the crossing of the WL wordline (row) and the bit line selected by $V_{w\_mux}$ and $V_{w\_mux}$' are selected and the bit cell logic value is written.

In FIG. 6, because the MTJ elements are not in the same order of pinned and free magnetic layers, the identical same configuration of addressing signals for rows and columns that would be used for a bit cell with a single MTJ element 20, can be used with two MTJ elements 20, shown adjacent to one another, associated together in one bit cell and kept in complementary resistance states. The same $V_{w\_mux}$ and $V_{w\_mux}$' signals and the same WL signals are used. This configuration is such that there is little added switching complication and the same circuit arrangements that were used for single MTJ element bit cells can now be used for bit cells with two complementary MTJ elements. Moreover, a single integrated circuit array can be partitioned, logically or physically, to employ some bit cells that use single MTJ elements 20 to represent a bit value, and others that use two paired complementary MTJs 20 to represent a big value.

A memory array containing bit cells using magnetoresistive techniques as provided herein can have an entire array of bit cells that all use two magnetic tunnel junction (MTJ) elements in a dual configuration as discussed, wherein one of two complementary MTJ elements 20 in each pair is in the normal order of pinned/free magnetic layers, while the other MTJ 20 is in a reversed free/pinned layer order relative thereto. The write current bias applied to both MTJ elements is at the same current polarity yet will traverse the pinned-free MTJ layers of the two MTJ elements 20 in opposite order, pinned-to-free and free-to-pinned.

That same current polarity advantageously is the same polarity as the polarity applied to one or more bit cells that have only one MTJ element 20 per bit cell. The same arrangements for the switching transistors are useful for each layer order and dual or single MTJ cell, which is facilitated by reversing the order of the free and pinned layers of the two paired MTJ elements 20 in bit cells having two MTJ elements.

Normal order, reverse order, single MTJ bit cells and paired MTJ bit cells are advantageously used in one circuit layout, for example in juxtaposed parts of one or two integrated circuit array. Although is possible to provide a circuit having MTJ cells with layers in different physical order, it may be more practical to manufacture circuits or discrete arrays within circuits, so that all of the included MTJ elements have layers that are all in the same order in that circuit or in distinct arrays or subsets of memory elements that are epitaxially built up on the same circuit chip or on discrete circuit chips. In such an arrangement having all the pinned and free layers applied in the same order, conductive paths can be arranged that are different for the MTJ elements that are physically in the same order of deposition, so that the MTJ elements are encountered by write bias currents in reverse order of pinned-free or free-pinned layer order due to providing different conductor paths to couple the MTJ layers into the write bias circuit configuration.

In another embodiment, it is possible to have two discretely produced circuit elements (or discretely different areas of the a same circuit), wherein the orders of the free and pinned layers are different on the two circuit elements due to the order of their deposition in epitaxial processes.

A set of normal and reverse order dual MTJ bit cells can be provided in an edge area of a circuit layout having a larger area devoted to normal order single MTJ bit cells. In this embodiment, the normal-reverse dual MTJ bit cells may be arranged to stand in for single MTJ bit cells that have failed a quality assurance selection test, or the dual MTJ bit cells may be used to store a distinct type of information that is perhaps crucial to correct operation whereas the normal order single MTJ bit cells are used for transitory information that is more error tolerant.

As described and shown, a digital memory apparatus as provided herein has at least one array of magneto resistive memory bit cells, each said bit cell in at least a subset of the array comprising at least a first magnetic tunnel junction element 20 and at least a second magnetic junction element 20, wherein each of the first and second magnetic tunnel junction elements comprises a pinned magnetic layer with a permanent magnetic field aligned in a reference direction, abutted against one another over a barrier layer. A free magnetic layer has a magnetic field changeably aligned parallel to the reference direction in a low resistance state RL or anti-parallel to the reference direction in a high resistance state RH. The first and second magnetic tunnel junction elements 20 are configured to maintain complementary resistance states RH/RL or RL/RH such that one of the first and second magnetic tunnel junction elements is in a low resistance state when the other is in a high resistance state, and vice versa. This state represents a changeable bit cell logic value 0 or 1.

One of the first and second magnetic tunnel junction elements MTJ can be deemed to have a 'normal' order of the pinned layer and free layer relative to a current path used for at least one of reading and writing to the bit cell. By comparison, the other of the first and second magnetic tunnel junction elements has a reverse order of the pinned layer and the free layer relative to the current path. A current bias at least for writing a bit cell logic value to the bit cell is applied to the current path in a same polarity to the first and second magnetic tunnel junction elements 20, whose pinned and free layers are disposed in normal and reverse orders relative to the path of the write current. This induces said complementary resistance states due to the normal order and reverse order of the pinned layer and the free layer of the first and second magnetic tunnel junction elements. Likewise, when applying a write current in one polarity, one logic state is achieved (RL/RH or RH/RL), and when applying a write current in the opposite polarity, the other logic state is achieved.

The MTJ cells and the bit cells that they make up, are useful as bit cells in an array of bit cells in an integrated circuit, wherein the first and second magnetic tunnel junction elements 20 are provided individually and/or in associated complementary pairs, disposed in respective columns addressed by bit line signals BL, BL' and rows addressed by word line signals WL. The first and second magnetic tunnel junction elements can be arranged in distinct areas of a memory circuit wherein the free and pinned layers are mounted in normal order within one of the distinct areas and in the reverse order within the other of the discrete memory circuits. The areas with normal and reverse order can be on a same integral circuit (the same substrate) or on physically distinct circuit elements (different substrates).

Figure 7:
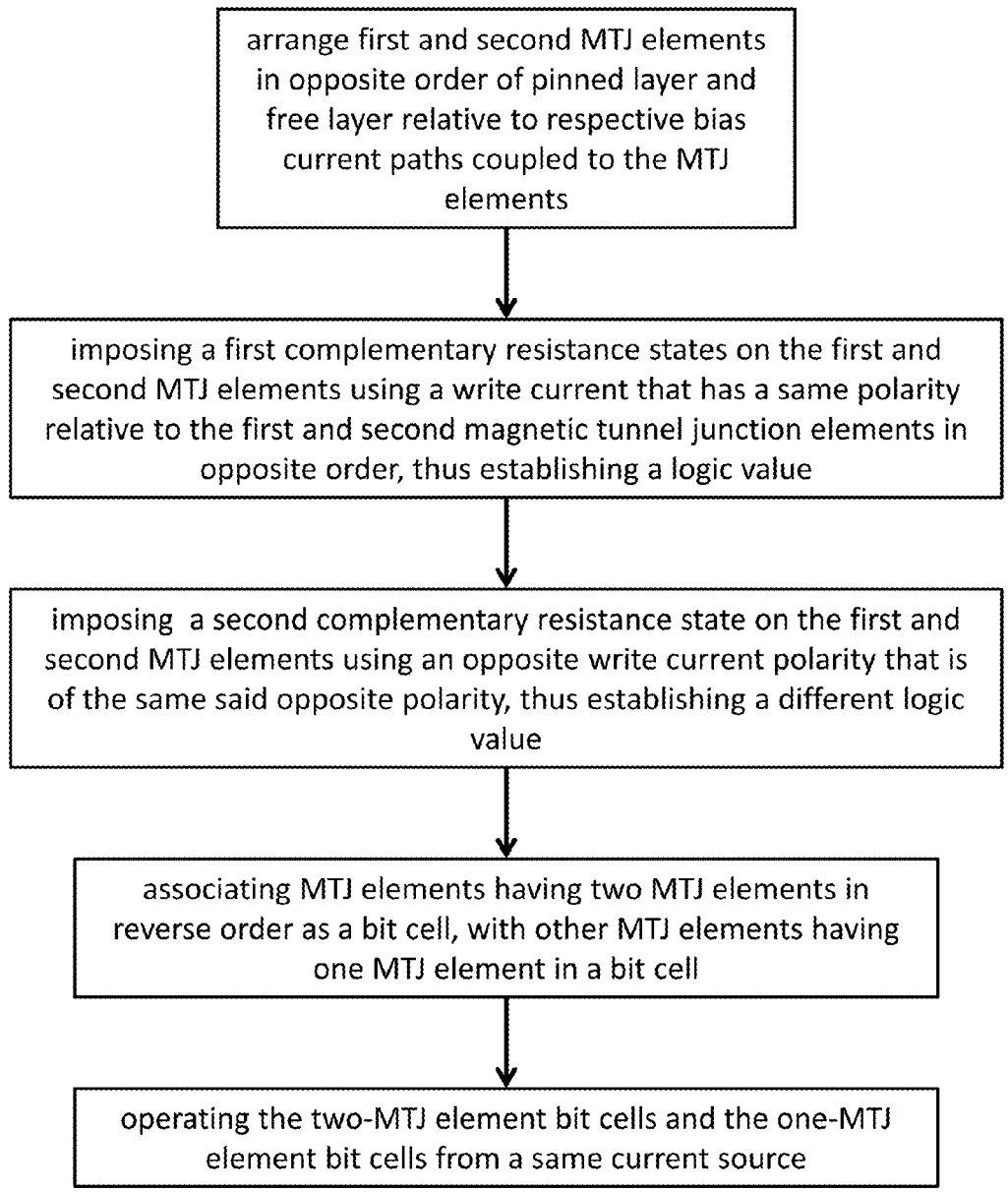
FIG. 7 is a flowchart showing method steps involved in configuring and operating MRAM devices as described.

These arrangements concern methods as well as apparatus, shown in the flowchart of FIG. 7. A method for configuring an STT-MRAM, having magneto resistive memory bit cells defining bit cells each having first and second magnetic tunnel junction elements 20 and each element 20 having a "pinned" magnetic layer with a magnetic field aligned in a reference direction and a "free" magnetic layer with a magnetic field changeably aligned parallel to the reference direction in a low resistance state or anti-parallel to the reference direction in a high resistance state, the first and second magnetic tunnel junction elements being maintained in complementary high and low or low and high resistance states representing a changeable bit cell logic value. The method includes arranging the pinned layer and the free layer of the first and second magnetic tunnel junction elements respectively in a normal order and a reverse order relative to one another along a bias current path, writing one of the complementary resistance states to the first and second magnetic junction elements using a write current with the same polarity to both of the first and second magnetic tunnel junction elements, and writing the other one of the complementary resistance states to the first and second magnetic junction elements using an opposite write current polarity that is of the same opposite polarity to both of the first and second magnetic tunnel junction elements.

By providing such a first array 44 and also at least one second array 42 of bit cells with single magnetic tunnel junction elements, the single-MTJ and paired complementary MTJ bit cells can be operated using the same current polarities for writing to the bit cells. The single magnetic tunnel junction elements preferable have pinned and free layers in said normal order relative to the current path. Therefore, writing to the single magnetic tunnel junction elements using a same current polarity as when writing bit cell logic values to the first and second magnetic tunnel junction elements. For reading from the bit cells, the single MTJ elements when conducting a read bias current are coupled to a voltage to a reference voltage using a voltage comparator. The paired complementary MTJ are similarly coupled to the inputs of a voltage comparator 32 to compare their resistances. The outputs SO of the voltage comparators 32 are logic values read from the bit cells.

The normal and reverse orders of the pinned layer and free layer of the first and second magnetic tunnel junction elements 20 can be established by deposition in normal and reverse orders on distinct areas of a circuit, or on distinct circuits. Alternatively, the conductive paths that apply current bias to the MTJ elements 20 can be arranged to place the elements in normal and reverse order along the bias current path although the free and pinned layers may have been deposited in the same order and thus physically arranged in the same order of deposition.

The subject matter has been disclosed in connection with exemplary embodiments and examples. It should be understood that the subject matter is not limited to the examples, and reference should be made to the appended claims to assess the scope of the invention in which exclusive rights are claimed.

We claim:

1. A digital memory apparatus, comprising:
at least one array of magnetoresistive memory bit cells, each said bit cell in at least a subset of the array comprising at least a first magnetic tunnel junction element and at least a second magnetic junction element, wherein each of the first and second magnetic tunnel junction elements comprises a pinned magnetic layer with a permanent magnetic field aligned in a reference direction, and a free magnetic layer with a magnetic field changeably aligned parallel to the reference direction in a low resistance state or anti-parallel to the reference direction in a high resistance state;
wherein the first and second magnetic tunnel junction elements are configured to maintain complementary resistance states such that one of the first and second magnetic tunnel junction elements is in a low resistance state when the other is in a high resistance state, and vice versa, thereby representing a changeable bit cell logic value;
wherein one of the first and second magnetic tunnel junction elements has a first order of the pinned layer and free layer relative to a current path used for at least one of reading and writing to the bit cell, and the other of the first and second magnetic tunnel junction elements has a second order of the pinned layer and the free layer relative to the current path that is opposite the first order;
wherein a current bias at least for writing a bit cell logic value to the bit cell is applied to the current path in a same polarity to the first and second magnetic tunnel junction elements, thereby inducing said complementary resistance states due to the normal order and reverse order of the pinned layer and the free layer of the first and second magnetic tunnel junction elements;
wherein the first and second magnetic tunnel junction elements are connected along the current path such that the free and pinned layers of one of the first and second magnetic tunnel junction elements is in said normal order and the other is in said reverse order;
wherein the first and second magnetic tunnel junction elements are arranged in adjacent rows of an array of said bit cells, and each of the bit cells is addressed by a first bit line and a second bit line signals having a same current polarity, the first and second bit line signals being complements of one another;
wherein the pinned layer of the first magnetic tunnel junction element is coupled to a first NMOS transistor and the free magnetic layer of the second magnetic tunnel junction element is coupled to a second NMOS transistor, the first and second NMOS transistors each having a gate coupled to a word line, the first and second NMOS transistors respectively coupled to a third NMOS transistor and a fourth NMOS transistor that are collectively configured to couple selectively the first and second magnetic tunnel junction elements to ground; and
wherein the free magnetic layer of the first magnetic tunnel junction element is coupled to a first PMOS transistor and the pinned magnetic layer of the second magnetic tunnel junction element is coupled to a second PMOS transistor, the first PMOS transistor configured to selectively couple the first bit line and the first magnetic tunnel junction element to a write voltage, and the second PMOS transistor configured to couple selectively the second bit line and the second magnetic tunnel junction element to the write voltage.

2. The digital memory apparatus of claim 1, wherein the first and second magnetic tunnel junction elements are provided in respective columns addressed by the first and second bit line signals and rows addressed by wordlines.

3. The digital memory apparatus of claim 2, wherein the first and second magnetic tunnel junction elements are arranged in distinct areas of a memory circuit and the free and pinned layers are mounted in the first order on one of the distinct areas and in the second order on the other of the discrete memory circuits.

4. The digital memory apparatus of claim 2, wherein the first and second magnetic tunnel junction elements are respectively arranged on discrete memory circuits and the free and pinned layers are mounted in the first order on one of the discrete memory circuits and in the second order on the other of the discrete memory circuits.

5. The digital memory apparatus of claim 1, wherein said same current polarity is reversed for writing the first and second magnetic tunnel junction elements to a first resistance state having a first resistance versus a second resistance state having a second resistance.

6. The digital memory apparatus of claim 1, further comprising at least a second subset of the array comprising bit cells with single magnetic tunnel junction elements for the bit cells of the second subset, the single magnetic tunnel junction elements having pinned and free layers in said first order relative to the current path, whereby the first and second magnetic tunnel junction elements and single magnetic tunnel junction elements being written using a same current polarity when writing the bit cell logic value.

7. The digital memory apparatus of claim 1, further comprising a sensing circuit for reading out the bit cell logic value, wherein a read current bias for sending the bit cell logic value is applied at a same polarity to the first and second magnetic tunnel junction elements.

8. The digital memory apparatus of claim 6, further comprising a sensing circuit for reading out the bit cell logic value, wherein a read current bias for sending the bit cell logic value is applied at a same polarity to the first and second magnetic tunnel junction elements.

9. The digital memory apparatus of claim 6, further comprising a sensing circuit for reading out the bit cell logic value, wherein a read current bias for sending the bit cell logic value is applied at a same polarity to the single magnetic tunnel junction elements.

10. A method for configuring an MRAM, having magnetoresistive memory bit cells defining bit cells each having a first magnetic tunnel junction element and a second magnetic tunnel junction element, each of the magnetic tunnel junction elements having a pinned magnetic layer with a magnetic field aligned in a reference direction and a free magnetic layer with a magnetic field changeably aligned parallel to the reference direction in a first resistance state or anti-parallel to the reference direction in a second resistance state, the first and second magnetic tunnel junction elements being maintained in complementary first and second resistance states representing a changeable bit cell logic value, wherein the method comprises:
arranging the pinned layer and the free layer of the first and second magnetic tunnel junction elements respectively in a first order and a second order relative to one another along a bias current path;
writing one of the first and second resistance states to the first and second magnetic tunnel junction elements using a write current with the same polarity to both of the first and second magnetic tunnel junction elements, and writing the other one of the first and second resistance states to the first and second magnetic tunnel junction elements using an opposite write current polarity that is of the same opposite polarity to both of the first and second magnetic tunnel junction elements, wherein the writing includes turning on a first PMOS transistor that is coupled to the free magnetic layer of the first magnetic tunnel junction element by a first bit line, turning on a first NMOS transistor that is coupled to the pinned magnetic layer of the first magnetic tunnel junction element and to ground through a third NMOS transistor, turning on a second PMOS transistor that is coupled to the pinned magnetic layer of the second magnetic tunnel junction element by a second bit line, turning on a second NMOS transistor that is coupled to the free magnetic layer of the second magnetic tunnel junction element and to ground through a fourth NMOS transistor; and providing at least one second array of bit cells with single magnetic tunnel junction elements, the single magnetic tunnel junction elements having pinned and free layers in said first order relative to the current path, and writing to the single magnetic tunnel junction elements using a same current polarity as when writing bit cell logic values to the first and second magnetic tunnel junction elements.

11. The method of claim 10, comprising establishing the first and second orders of the pinned layer and free layer of the first and second magnetic tunnel junction elements by deposition in said first and second orders on distinct areas of a circuit.

12. The method of claim 10, comprising establishing the first and second orders of the pinned layer and free layer of the first and second magnetic tunnel junction elements by deposition in a same order on a circuit and providing associated conductors for placing the first and second magnetic tunnel junction elements in said first and second orders along the current path.

13. The method of claim 10, further comprising reading the first and second resistance states of the first and second magnetic tunnel junction elements to discern a bit cell logic value, using a fixed read current polarity.

14. A digital memory apparatus, comprising:
an array of magnetoresistive memory bit cells addressable as memory words, a bit cell in the array comprising a first magnetic tunnel junction element and a second magnetic junction element, wherein each of the first and second magnetic tunnel junction elements of the bit cell comprises a pinned magnetic layer with a permanent magnetic field aligned in a reference direction, and a free magnetic layer with a magnetic field changeably aligned parallel to the reference direction in a first resistance state or anti-parallel to the reference direction in a second resistance state;

wherein the first and second magnetic tunnel junction elements are configured to maintain complementary resistance states such that one of the first and second magnetic tunnel junction elements is in a first resistance state when the other is in a second resistance state, and vice versa, thereby representing a changeable bit cell logic value;

a comparison circuit for discerning the bit cell logic value of the bit cell when addressed for a read operation;

wherein one of the first and second magnetic tunnel junction elements has a first order of the pinned layer and free layer along a current path used for at least one of reading and writing to the bit cell, and the other of the first and second magnetic tunnel junction elements has a second order of the pinned layer and the free layer;

wherein a current bias at least for writing a bit cell logic value to the bit cell is applied to the current path in a same polarity to the first and second magnetic tunnel junction elements, thereby inducing said complementary resistance states due to the first order and second order of the pinned layer and the free layer of the first and second magnetic tunnel junction elements; and wherein the pinned layer of the first magnetic tunnel junction element is coupled to a first NMOS transistor and the free magnetic layer of the second magnetic tunnel junction element is coupled to a second NMOS transistor, the first and second NMOS transistors each having a gate coupled to a word line, the first and second NMOS transistors respectively coupled to a third NMOS transistor and a fourth NMOS transistor that are collectively configured to couple selectively the first and second magnetic tunnel junction elements to ground; and wherein the free magnetic layer of the first magnetic tunnel junction element is coupled to a first PMOS transistor and the pinned magnetic layer of the second magnetic tunnel junction element is coupled to a second PMOS transistor, the first PMOS transistor configured to selectively couple the first bit line and the first magnetic tunnel junction element to a write voltage, and the second PMOS transistor configured to couple selectively the second bit line and the second magnetic tunnel junction element to the write voltage.

15. The digital memory apparatus of claim 14, wherein the bit cell is a member of a subset of bit cells in the memory apparatus and at least one other subset of bit cells in the memory apparatus is configured with one magnetic tunnel junction element per bit cell.

16. The digital memory apparatus of claim 14, wherein the first and second magnetic tunnel junction elements are respectively arranged on distinct memory circuits and the free and pinned layers are mounted in the first order on one of the distinct memory circuits and in the second order on the other of the discrete memory circuits.

17. The digital memory apparatus of claim 16, wherein the distinct memory circuits are disposed on distinct circuit chips.

* * * * *